(12) United States Patent
Chang et al.

(10) Patent No.: US 11,557,462 B2
(45) Date of Patent: Jan. 17, 2023

(54) COLLECTING AND RECYCLING RARE GASES IN SEMICONDUCTOR PROCESSING EQUIPMENT

(71) Applicant: KLA CORPORATION, Milpitas, CA (US)

(72) Inventors: Chao Chang, San Jose, CA (US); Michael Friedmann, Mountain View, CA (US)

(73) Assignee: KLA CORPORATION, Milpitas, CA (US)

( * ) Notice: Subject to any disclaimer, the term of this patent is extended or adjusted under 35 U.S.C. 154(b) by 375 days.

(21) Appl. No.: 16/814,319

(22) Filed: Mar. 10, 2020

(65) Prior Publication Data

US 2020/0294774 A1 Sep. 17, 2020

Related U.S. Application Data

(60) Provisional application No. 62/817,702, filed on Mar. 13, 2019.

(51) Int. Cl.
*H01J 37/32* (2006.01)
*B01D 53/04* (2006.01)
(Continued)

(52) U.S. Cl.
CPC ...... *H01J 37/32449* (2013.01); *B01D 53/047* (2013.01); *B01D 53/0462* (2013.01); *B01D 53/22* (2013.01); *B01D 2256/18* (2013.01); *B01D 2259/45* (2013.01); *F25J 2215/34* (2013.01); *F25J 2215/36* (2013.01)

(58) Field of Classification Search
CPC ........... H01J 37/32449; B01D 53/0462; B01D 53/047; B01D 53/22; B01D 2256/18; B01D 2259/45; B01D 2257/102; B01D 2257/104; B01D 2257/108; B01D 2257/11; B01D 53/0476; B01D 2258/0216; B01D 3/00; F25J 2215/34; F25J 2215/36; H01L 21/67017
See application file for complete search history.

(56) References Cited

U.S. PATENT DOCUMENTS 6,217,633 B1 4/2001 Ohmi et al.
6,605,134 B2 8/2003 Ishihara et al.
(Continued)

FOREIGN PATENT DOCUMENTS

JP 2004179191 A 6/2004
WO WO-03047731 A1 * 6/2003 ............. B01D 53/46
(Continued)

OTHER PUBLICATIONS

WIPO, ISR for PCT/US2020/022208, dated Jul. 2, 2020.

*Primary Examiner* — Joseph J Dallo
(74) *Attorney, Agent, or Firm* — Hodgson Russ LLP

(57) ABSTRACT

A process chamber, such as for semiconductor processing equipment, is connected with a recovery unit. The recovery unit includes a first storage tank for buffer gas and a second storage tank for rare gas. Both storage tanks are connected with a column in the recovery unit. The recovery unit and process chamber can operate as a closed system. The rare gas can be transported at a variable flow rate while separation in the recovery unit operates at a constant flow condition.

20 Claims, 5 Drawing Sheets

(51) Int. Cl.
*B01D 53/047* (2006.01)
*B01D 53/22* (2006.01)

(56) References Cited

U.S. PATENT DOCUMENTS

| | | |
|---|---|---|
| 7,258,725 B2 | 8/2007 | Ohmi et al. |
| 7,300,497 B2 | 11/2007 | Urakami et al. |
| 8,535,414 B2 | 9/2013 | Johnson et al. |
| 9,168,467 B1 | 10/2015 | Bondarenko et al. |
| 9,649,590 B2 | 5/2017 | Albright et al. |
| 2001/0015133 A1 | 8/2001 | Sakai et al. |
| 2005/0109419 A1 | 5/2005 | Ohmi et al. |
| 2005/0235828 A1 | 10/2005 | Ishihara |
| 2006/0130649 A1* | 6/2006 | Jain .................... C01B 23/0052 95/82 |
| 2011/0023908 A1 | 2/2011 | Neuber et al. |
| 2012/0012201 A1 | 1/2012 | Winchester et al. |
| 2013/0008311 A1 | 1/2013 | Ohuchi et al. |
| 2019/0003766 A1 | 1/2019 | Howard |

FOREIGN PATENT DOCUMENTS

| | | | |
|---|---|---|---|
| WO | WO-2007055035 A1 * | 5/2007 | ........... B01D 53/053 |
| WO | WO-2017072863 A1 * | 5/2017 | ............. B01D 53/04 |

* cited by examiner

COLLECTING AND RECYCLING RARE GASES IN SEMICONDUCTOR PROCESSING EQUIPMENT

CROSS-REFERENCE TO RELATED APPLICATIONS

This application claims priority to the provisional patent application filed Mar. 13, 2019 and assigned U.S. application Ser. No. 62/817,702, the disclosure of which is hereby incorporated by reference.

FIELD OF THE DISCLOSURE

This disclosure relates to semiconductor processing equipment.

BACKGROUND OF THE DISCLOSURE

The demand for valuable rare gases is growing. Xenon is a trace component of the atmosphere (87 ppb) and it is a byproduct of a complicated air separation process, which makes it an expensive material for semiconductor processing applications or other applications. For example, xenon is finding increased uses in applications such as anesthesia, ion propulsion engines, high intensity discharge in lighting, plasma etching in semiconductor manufacturing, plasma media in discharge, or laser produced plasma. The increased number of applications is often constrained by the limited supply of xenon. It would be helpful to collect and recycle valuable rare gases, like xenon, at highest recovery efficiency.

The recovery efficiency of a rare gas recovery unit affects how much rare gas is collected. Typical performance is in the range of 90% to 99.9%. There is generally 0.1% to 10% of residual rare gas, such as Xe, that is lost when the buffer gas is vented or otherwise removed. Improvement of the recovery efficiency may not be feasible or may be costly depending on the gas separation technology and implementation.

The impact of loss of residual rare gas to long term cost of ownership in, for example, a semiconductor processing tool can be significant. Negative impacts to cost of ownership can be especially severe when the rare gas flow is at high flow rates of several liters per minute and the process chamber operates nearly 24 hours a day, which is common in semiconductor manufacturing.

Therefore, what is needed is new systems and methods that collect and recycle rare gases.

BRIEF SUMMARY OF THE DISCLOSURE

A system is provided in a first embodiment. The system comprises a process chamber that uses xenon and/or krypton and a recovery unit in fluid communication with the process chamber. The recovery unit includes: a mixture tank in fluid communication with the process chamber via a gas exhaust line; a first column in fluid communication with the mixture tank; a second column in fluid communication with the mixture tank; a first storage tank in fluid communication with the first column and the process chamber; a second storage tank in fluid communication with the second column and the process chamber; a first gas supply line connecting the first storage tank to the process chamber; a second gas supply line connecting the second storage tank to the process chamber; a first loopback line connecting the first gas supply line to the gas exhaust line; and a second loopback line connecting the second gas supply line to the exhaust line.

The gas exhaust line can include a vacuum pump.

The system can further include a compressor pump in fluid communication with the mixture tank, the first column, and the second column.

The recovery unit can use at least one of pressure swing adsorption, vacuum swing adsorption, or temperature swing adsorption.

The recovery unit can use cryogenic distillation.

The recovery unit can use membrane separation.

The recovery unit can be a closed loop system with the process chamber.

The system can further include a plurality of the process chambers in fluid communication with the gas exhaust line, the first gas supply line, and the second gas supply line. Each of the process chambers can operate at a different gas supply flow rate.

A method is provided in a second embodiment. The method comprises processing a semiconductor wafer in a process chamber with a process gas. The process gas includes a rare gas and buffer gas. The process gas is pumped from the process chamber to a mixture tank via a gas exhaust line. The process gas is pumped from the mixture tank to a first column and a second column. The process gas is separated in the first column and the second column. The buffer gas is transported from the first column to a first storage tank. The rare gas is transported from the second column to a second storage tank. The buffer gas is transported to the process chamber from the first storage tank and the rare gas is transported to the process chamber from the second storage tank.

The rare gas can include at least one of xenon or krypton. The buffer gas can include at least one of argon, neon, oxygen, nitrogen, or hydrogen.

The method can further include diverting at least some of the rare gas from the second gas supply line to the gas exhaust line instead of the process chamber.

The method can further include diverting at least some of the buffer gas from the first gas supply line to the gas exhaust line instead of the process chamber.

Pumping the process gas from the process chamber to the mixture tank can use a vacuum pump. Pumping the process gas from the mixture tank to the first column and the second column can use a compressor pump.

The separating can use at least one of pressure swing adsorption, vacuum swing adsorption, or temperature swing adsorption.

The separating can use cryogenic distillation.

The separating can use membrane separation.

The method can be performed in a closed system.

Transporting the rare gas from the second storage tank can be at a variable flow rate while the separating operates at a constant flow condition.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein include gas collection and recycling systems and methods. The rare gas contained in the exhaust from the process chamber can be separated, purified, and re-supplied with virtually no loss of the highly valuable rare gas. Lower loss of rare gases, such as Xe, lowers the cost of ownership for the system. Furthermore, the process chamber can run at variable gas supply flow rates while the recovery unit operates at constant optimized flow conditions for an improved combination of recovery efficiency and purity. Multiple process chambers can run at different gas supply flow rates while sharing a single recovery unit.

In semiconductor processing equipment, a rare gas like xenon or krypton is often supplied to a process chamber with another buffer gas. Such combination include, but are not limited to, Xe/Ar, Xe/Ne, Xe/He, Xe/$O_2$, Xe/$N_2$, Xe/$H_2$, Kr/Ar, Kr/Ne, Kr/He, Kr/$O_2$, Kr/$N_2$, Kr/$H_2$, Xe/Kr, etc. In the case of discharge or laser produced plasma, xenon atoms can be highly ionized and excited to various energetic ionic states under electron impact or laser field. The transitions between dense electronic configuration manifolds results in a broadband emission covering infrared (IR), visible, ultraviolet (UV), extreme ultraviolet (EUV), and x-ray. Buffer gases such as Ar, Ne, $O_2$, $N_2$, or $H_2$ may be used to slow down (and eventually stop) the energetic Xe or Kr ions to prevent etching of the process chamber. While Kr is considered a rare gas, Kr can be used as a buffer gas for Xe. One or more buffer gases can be used with one or more rare gases. The exhaust of the process chamber is pumped out by the vacuum pumps and sent to a rare gas recovery unit, where Xe and/or Kr is separated from the buffer gas, such as Ar, Ne, $O_2$, $N_2$, or $H_2$. The rare gas can be purified by gas separation technologies. Such purification technologies include adsorption separation, cryogenic distillation (e.g., U.S. Pat. No. 9,168,467), or membrane separation. Pressure swing adsorption (e.g., U.S. Pat. No. 7,300,497), vacuum swing adsorption (e.g., U.S. Pat. No. 8,535,414), and temperature swing adsorption can be used for adsorption separation. The patents disclosed herein are incorporated by reference in their entireties.

Figure 1:
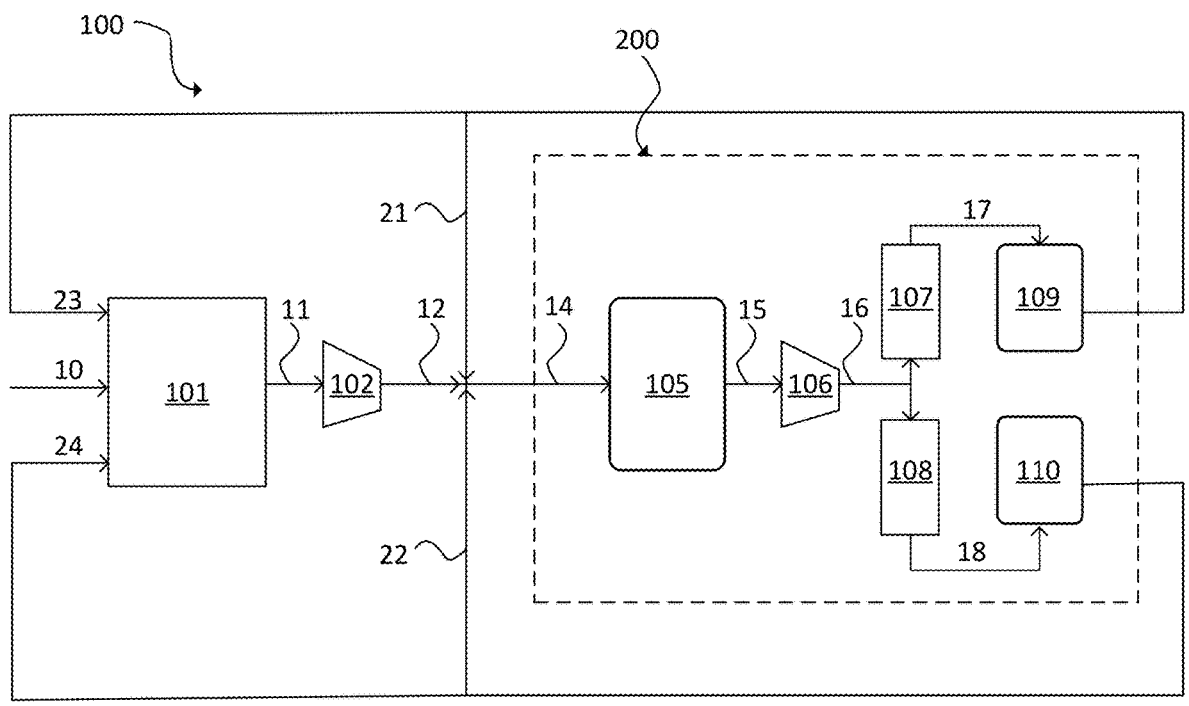
FIG. 1 is a diagram of an embodiment of a system in accordance with the present disclosure.

FIG. 1 is a diagram of an embodiment of a system 100. The system 100 includes a process chamber 101 and a recovery unit 200. The process chamber 101 is connected with a gas source line 10, which can provide the rare gas or gases and the buffer gas or gases. The recovery unit 200 is in fluid communication with the process chamber 101. The process chamber 101 that circulates the rare gas and the buffer gas can be part of a semiconductor inspection or metrology system, such as the light source or the measurement chamber of the system 100. The process chamber 101 also can be part of a critical dimension metrology system, a reticle inspection system, laser-produced plasma source, an etching chamber, or other semiconductor processing, inspection, metrology, or review system. For example, the process chamber 101 can be part of a xenon plasma focused ion beam system or a xenon plasma etching system. Applications outside the semiconductor industry also are possible. For example, the process chamber 101 can be part of a xenon thruster test chamber used for space propulsion research.

The recovery unit 200 includes a mixture tank 105 in fluid communication with the process chamber 101 via a gas exhaust line 11/12/14, which includes the total incoming flow section 14. A first column 107 and a second column 108 are in fluid communication with the mixture tank 105 via conduit 15/16. A first storage tank 109 is in fluid communication with the first column 107 via conduit 17, the process chamber 101, and the gas exhaust line 11/12/14. A second storage tank 110 is in fluid communication with the second column 108 via conduit 18, the process chamber 101, and the gas exhaust line 11/12/14. Other connections between the second column 108 and first storage tank 109 or the first column 107 and the second storage tank 110 are possible. A first gas supply line 23 connects the first storage tank 109 to the process chamber 101. A second gas supply line 24 connects the second storage tank 110 to the process chamber 101.

The gas exhaust line 11/12/14 can include a vacuum pump 102. The conduit 15/16 connecting the mixture tank 105 to the first column 107 and the second column 108 can include a compressor pump 106.

The gas exhaust 11 from the process chamber 101 can be pumped out and sent to a recovery unit 200 by the vacuum pump 102. The received gases of the recovery unit 200 are held in a mixture tank 105, and then can be pumped to the gas separation columns 107, 108, where they are pressurized by the compressor pump 106. The filler material, temperature, and pressure (or vacuum) inside the gas separation columns 107, 108 may be different depending on the selection of gas separation technologies. In general, the purified rare gas such as Xe and the purified buffer gas such as $N_2$, appear at the opposite ends of the columns 107, 108, which may use a certain temperature/pressure profile in the columns. The purified rare gas, such as Xe, can be stored in the second storage tank 110 and can be transported back to the process chamber 101 via the second gas supply line 24. The second storage tank 110 can have less than 100% of rare gas, and may contain impurities or a small amount of buffer gas. The purified low-cost buffer gas, such as $N_2$, can be stored in the first storage tank 109 and can be transported back to the process chamber 101 via the first gas supply line 23. The first storage tank 109 can have less than 100% of buffer gas, and may contain impurities or a small amount of rare gas. A pump can be used to transport gases in the first and second gas supply lines 23, 24.

The system 100 can include a first loopback line 21 connecting the first gas supply line 23 to the gas exhaust line 11/12/14. The combination of flows from the first loopback line 21 and the gas exhaust line 11/12/14 can form the total incoming flow section 14.

The system 100 can include a second loopback line 22 connecting the second gas supply line 24 to the gas exhaust line 11/12/14. The combination of flows from the second loopback line 22 and the gas exhaust line 11/12/14 can form the total incoming flow section 14.

The first and second loopback lines 21, 22 are provided for the output flows from the recovery unit 200. The flow rate of the first gas supply line 23 and the second gas supply line 24 to the process chamber 101 can be adjusted or closed (such as using one or more valves) without affecting the status of the recovery unit 200. Flow diverted from the first gas supply line 23 is diverted to the first loopback line 21. Flow diverted from the second gas supply line 24 is diverted to the second loopback line 22. The flow diverted to the first loopback line 21 or second loopback line 22 can be from 0% to 100%, and the first and second loopback lines 21, 22 can have differing amounts of flow diverted into them. The gas flow in total incoming flow section 14 of the recovery unit 200 and the partial pressures within the total incoming flow section 14 can be kept constant.

Gas exhaust line 12, first loopback line 21, second loopback line 22, first gas supply line 23, and second gas supply line 24 may include one-way valves or other types of valves.

The system 100 can request a certain flow of the rare gas and a certain flow of the buffer gas that are delivered through first gas supply line 23 and second gas supply line 24. First storage tank 109 and second storage tank 110 can provide a constant flow that that is larger than the maximum demand at the process chamber 101. The surplus can be recirculated through the recovery unit 200, such as in a continuous manner.

The recovery unit 200 can use one or more of pressure swing adsorption, vacuum swing adsorption, temperature swing adsorption, cryogenic distillation, or membrane separation. Other techniques are possible.

As shown in FIG. 1, the first storage tank 109 is added for a buffer gas, such as $N_2$, and the buffer gas is recirculated to the process chamber 101 like the rare gas, such as Xe, from the second storage tank 110. In an instance, the recovery unit 200 is a closed loop system with the process chamber 101. All residual rare gas first storage tank 109 and first gas supply line 23 is kept in the system with virtually no loss.

Figure 2:
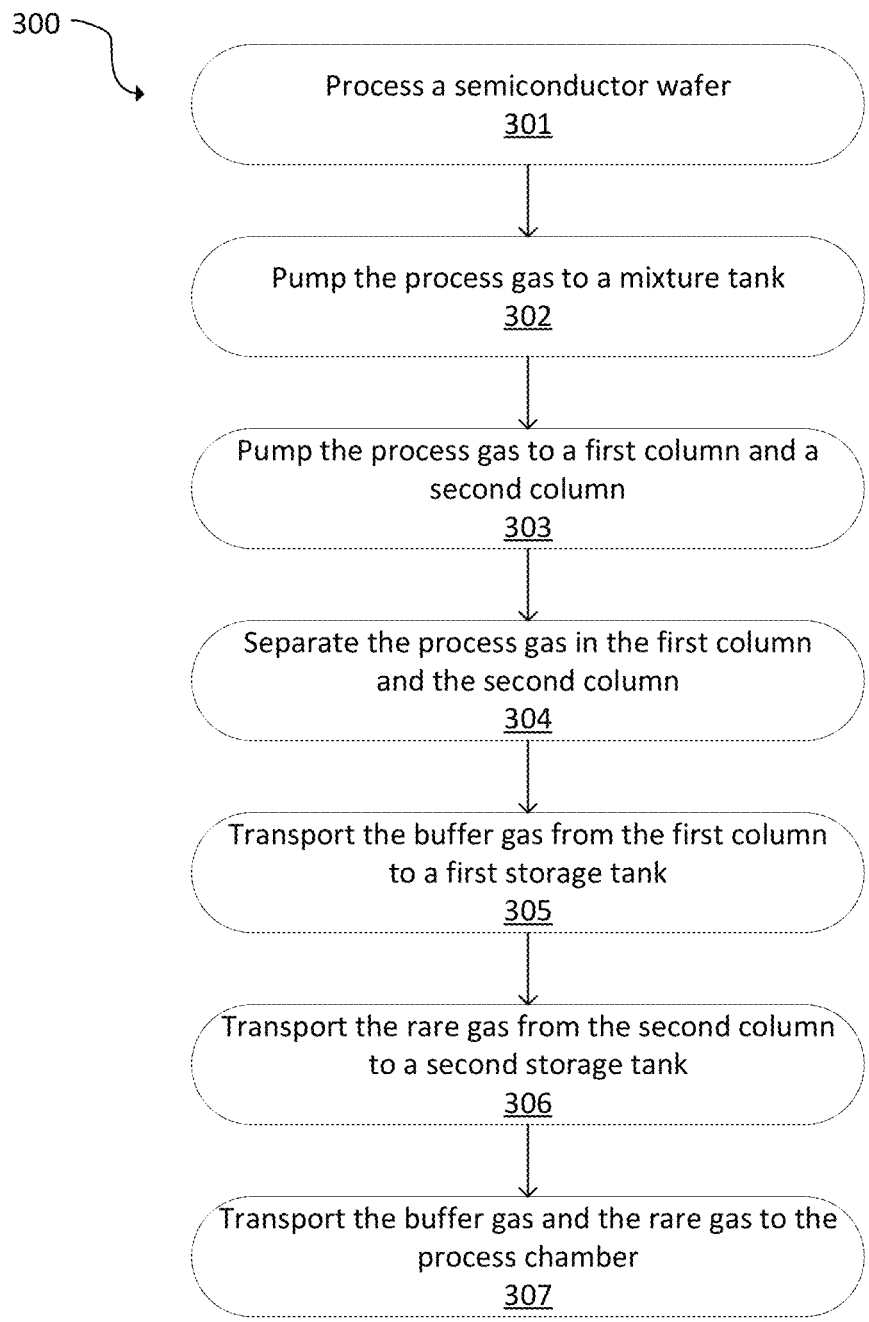
FIG. 2 is a block diagram of a method in accordance with the present disclosure.

FIG. 2 is a block diagram of a method 300, which can be applied in the system 100 of FIG. 1. At 301, a semiconductor wafer is processed in a process chamber with a process gas. The process gas includes a rare gas and a buffer gas. The rare gas can include at least one of xenon or krypton. The buffer gas can include at least one of argon, neon, oxygen, nitrogen, or hydrogen. Other rare gases or buffer gases are possible.

The process gas is pumped from the process chamber to a mixture tank via a gas exhaust line at 302 using, for example, a vacuum pump. The process gas is pumped from the mixture tank to a first column and a second column at 303 using, for example, a compressor pump. The process gas is separated in the first column and the second column at 304. The separation can use one or more of pressure swing adsorption, vacuum swing adsorption, or temperature swing adsorption, cryogenic distillation, or membrane separation.

The buffer gas is transported from the first column to a first storage tank at 305. The rare gas is transported from the second column to a second storage tank at 306. The buffer gas and the rare gas are transported to the process chamber at 307. Thus, the method 300 can be performed in a closed system.

In an instance, the rare gas can be transported at a variable flow rate while the separating operates at a constant flow condition.

In an instance, at least some of the rare gas is diverted from the second gas supply line to the gas exhaust line and/or at least some of the buffer gas is diverted from the gas supply line to the gas exhaust line. Thus, some or all of the rare gas and/or buffer gas bypasses the process chamber. For example, the process chamber may not be in use or may be under repair and the gas may be recirculated through the recycling system until the process chamber is online again.

For example, gas supplies to the process chamber can be closed and the process chamber exhaust can be switched to air while closing its connection port. The process chamber can be pumped down to vacuum and an associated recovery unit can be primed to design operation conditions. The recovery unit can be run with the first and second loopback lines fully open. The recovery can then be stabilized at an optimal combination of recovery efficiency and purity. The gas exhaust line can be switched, connected, or opened to the total incoming flow section. The flow rates of the first and second gas supply lines can be set to the process chamber. The flow rate of the first loopback line may be the difference of the output from the first storage tank minus the flow in the first gas supply line. The flow rate of the second loopback line may be the difference of the output from the second storage tank minus the flow in the second gas supply line.

Figure 3:
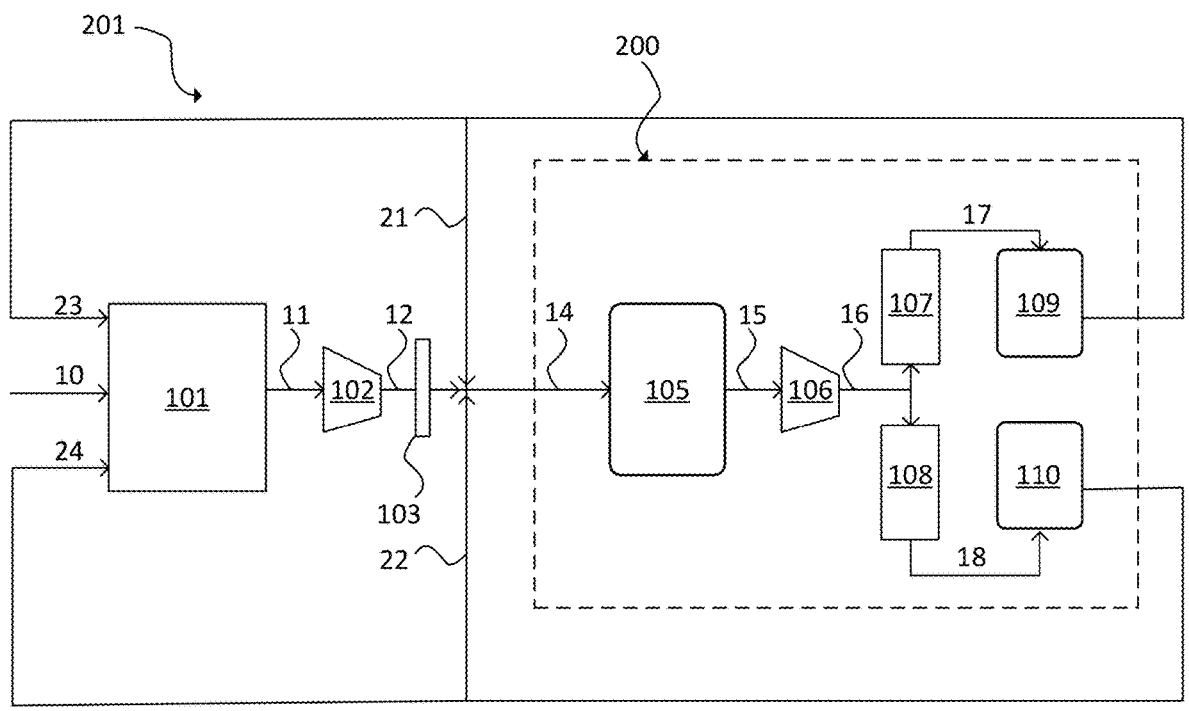
FIG. 3 is a diagram of another embodiment of a system in accordance with the present disclosure.

As shown in FIG. 3, the system 100 can further include a gas scraper 103 in fluid communication with the process chamber 101 and the mixture tank 105. The gas scraper 103 may be on the gas exhaust line 11/12/14. The gas scraper (103) can remove contamination from the process chamber 101. Such contamination may include the leaked $O_2$ into the chamber from the ambient air, hydrocarbon of the vacuum lubricant, outgassing from the chamber materials, or other sources. The gas scraper 103 may include one or more of, for example, a filter, absorber, cryogenic trap, getter, or catalyst converter.

Figure 4:
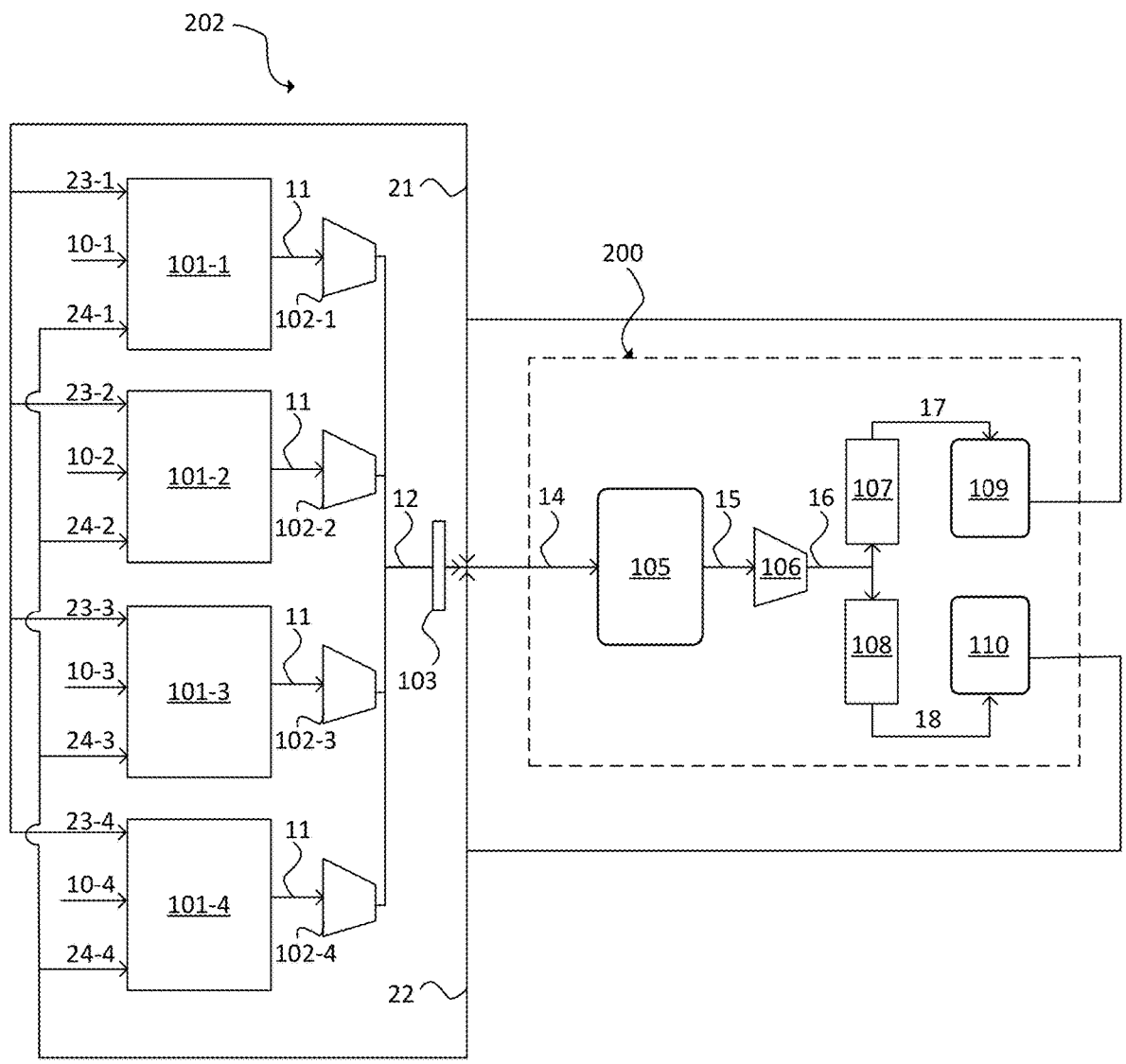
FIG. 4 is a diagram of an embodiment of a system with multiple process chambers in accordance with the present disclosure.

As shown in FIG. 4, multiple process chambers 101-1 through 101-4 can be used in the system 202. While four process chambers are illustrated, more or fewer process chambers can be included. The maximum number of process chambers can be dictated by the performance of the recovery unit 200. Each of the process chambers 101-1 through 101-4 is in fluid communication with the gas exhaust line 11/12/14 and can run at a different flow rate of gas supply, such as using a mass flow controller or other controller. Each of the process chambers is connected to a gas source line 10-1 through 10-4, a first gas supply line 23-1 through 23-4, and a second gas supply line 24-1 through 24-4. While each chamber has a gas source line 10-1 through 10-4, fewer than all chambers can have a gas source line. Some may only be connected to a first and second gas supply line.

Figure 5:
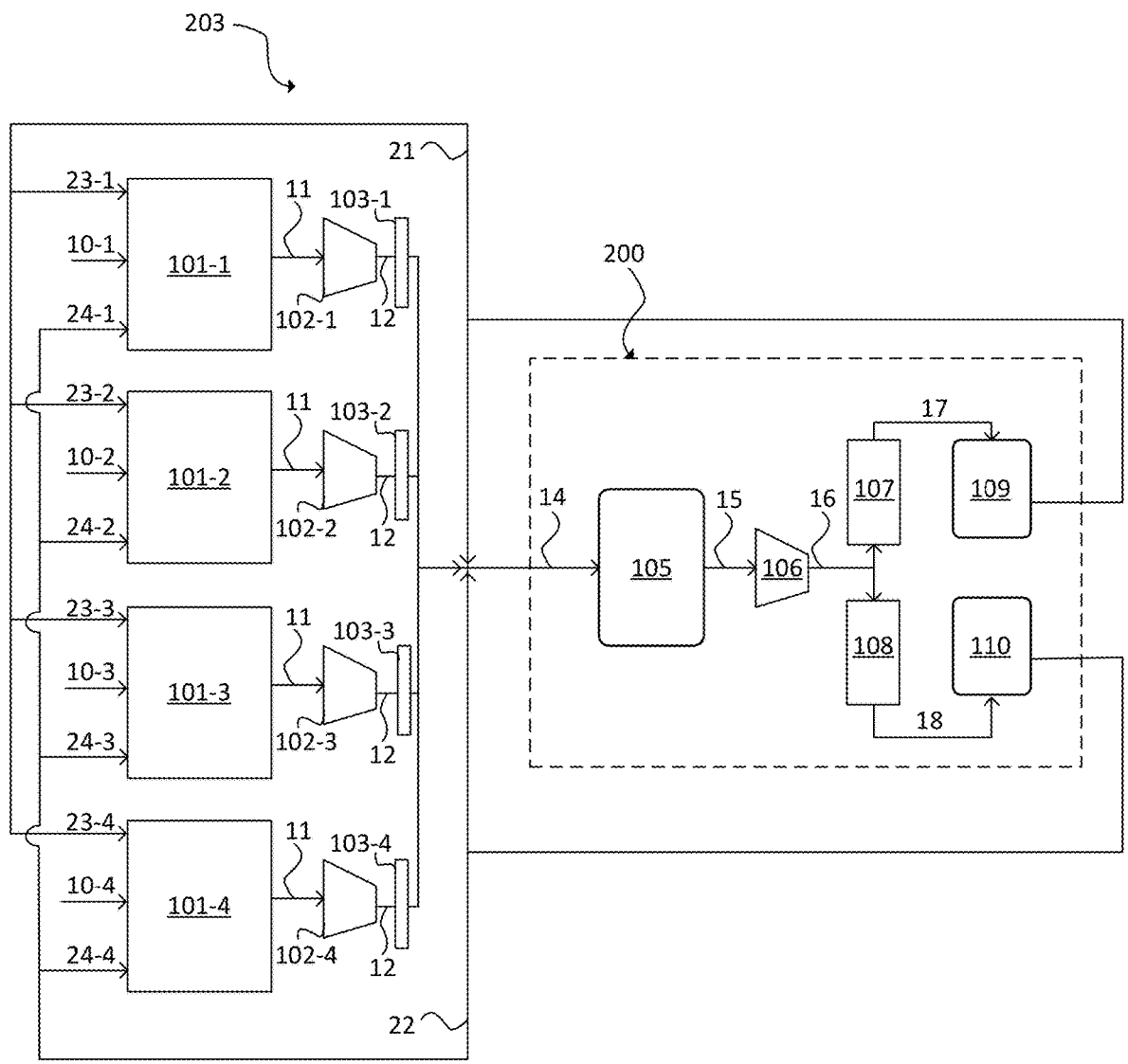
FIG. 5 is a diagram of another embodiment of a system with multiple process chambers in accordance with the present disclosure.

As shown in the system 203 of FIG. 5, the process chambers 101-1 through 101-4 can each have a separate gas scraper 103-1 through 103-4.

Using the systems and methods disclosed herein, a full close-loop system for gas collecting and recycling can be implemented, which can result in virtually no loss of the valuable rare gases. Loop-back lines can allow the process chamber to run at variable gas supply flow rates while the recovery unit can run at a constant incoming flow condition optimized for the best combination of recovery efficiency and purity. Gas scrapers may be added to remove contaminations and/or impurities that have impact on the performances of the recovery unit or the process chamber. Multiple process chambers may share a single recovery unit. Each of these process chambers may run at different flow rates of the gas supplies. Each of these process chambers may use different gas scrapers to remove the contaminations and/or impurities.

In an instance, the systems disclosed herein can operate with only 0.01% loss of rare gas. These losses may occur during repairs of any gas scrapers or during process chamber cleaning.

In an example, a xenon laser-produced plasma (LPP) soft x-ray source uses $N_2$ as a buffer gas to stop energetic xenon ions generated in the plasma to prevent etching of the chamber and damage of the optics. This soft x-ray source recovers xenon from $N_2$ buffer gas using a recovery unit. In this example, the recovery unit is a commercial pressure swing adsorption (PSA) recovery unit. Use of the embodiments disclosed herein can mitigate the risk of any slow long-term drift or unforeseeable lower xenon recovery efficiency of the recovery unit. Recovery efficiency is the factor affecting cost of ownership of the tool. Sharing of a single recovery unit by multiple tools can further lower the cost of the ownership. The recovery unit can be scaled for the desired flows.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a process chamber that uses xenon and/or krypton; and
   a recovery unit in fluid communication with the process chamber, wherein the recovery unit includes:
   a mixture tank in fluid communication with the process chamber via a gas exhaust line;
   a first column in fluid communication with the mixture tank;
   a second column in fluid communication with the mixture tank;
   a first storage tank in fluid communication with the first column and the process chamber;
   a second storage tank in fluid communication with the second column and the process chamber;
   a first gas supply line connecting the first storage tank to the process chamber;
   a second gas supply line connecting the second storage tank to the process chamber;
   a first loopback line connecting the first gas supply line to the gas exhaust line; and
   a second loopback line connecting the second gas supply line to the exhaust line.

2. The system of claim 1, wherein the gas exhaust line includes a vacuum pump.

3. The system of claim 1, further comprising a compressor pump in fluid communication with the mixture tank, the first column, and the second column.

4. The system of claim 1, wherein the recovery unit uses at least one of pressure swing adsorption, vacuum swing adsorption, temperature swing adsorption, cryogenic distillation, or membrane separation.

5. The system of claim 1, wherein the recovery unit is a closed loop system with the process chamber.

6. The system of claim 1, further comprising a plurality of the process chambers in fluid communication with the gas exhaust line, the first gas supply line, and the second gas supply line, wherein each of the process chambers operates at a different gas supply flow rate.

7. A method comprising:
   processing a semiconductor wafer in a process chamber with a process gas, wherein the process gas includes a rare gas and buffer gas;
   pumping the process gas from the process chamber to a mixture tank via a gas exhaust line;
   pumping the process gas from the mixture tank to a first column and a second column;
   separating the process gas in the first column and the second column;
   transporting the buffer gas from the first column to a first storage tank;
   transporting the rare gas from the second column to a second storage tank;
   transporting the buffer gas from the first storage tank and the rare gas from the second storage tank to the process chamber;
   diverting at least some of the rare gas from the second gas supply line to the gas exhaust line instead of the process chamber; and
   diverting at least some of the buffer gas from the first gas supply line to the gas exhaust line instead of the process chamber.

8. The method of claim 7, wherein the rare gas includes at least one of xenon or krypton, and wherein the buffer gas includes at least one of argon, neon, oxygen, nitrogen, or hydrogen.

9. The method of claim 7, wherein pumping the process gas from the process chamber to the mixture tank uses a vacuum pump, and wherein pumping the process gas from the mixture tank to the first column and the second column uses a compressor pump.

10. The method of claim 7, wherein the separating uses at least one of pressure swing adsorption, vacuum swing adsorption, temperature swing adsorption, cryogenic distillation, or membrane separation.

11. The method of claim 7, wherein the method is performed in a closed system.

12. The method of claim 7, wherein transporting the rare gas from the second storage tank is at a variable flow rate while the separating operates at a constant flow condition.

13. The system of claim 1, wherein the process chamber is part of a semiconductor inspection system.

14. The system of claim 1, wherein the process chamber is part of a semiconductor metrology system.

15. The system of claim 1, wherein the process chamber is part of a semiconductor etching system.

16. The system of claim 1, wherein the process chamber is a light source.

17. The system of claim 1, wherein the process chamber is a measurement chamber.

18. The method of claim 7, wherein the process chamber is part of a semiconductor inspection system, semiconductor metrology system, or semiconductor etching system.

19. The method of claim 7, wherein the process chamber is a light source.

20. The method of claim 7, wherein the process chamber is a measurement chamber.

* * * * *